US008912596B2

(12) United States Patent
Yamazaki

(10) Patent No.: US 8,912,596 B2
(45) Date of Patent: Dec. 16, 2014

(54) SEMICONDUCTOR DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 145 days.

(21) Appl. No.: 13/543,069

(22) Filed: Jul. 6, 2012

(65) Prior Publication Data

US 2013/0015436 A1   Jan. 17, 2013

(30) Foreign Application Priority Data

Jul. 15, 2011   (JP) .................. 2011-156225

(51) Int. Cl.
H01L 29/66      (2006.01)
H01L 29/423     (2006.01)
H01L 29/45      (2006.01)
H01L 29/786     (2006.01)

(52) U.S. Cl.
CPC .......... H01L 29/42384 (2013.01); H01L 29/45 (2013.01); H01L 29/78642 (2013.01); H01L 29/7869 (2013.01)
USPC ............... 257/331; 257/E29.264; 257/341; 257/330; 257/333

(58) Field of Classification Search
CPC ............ H01L 29/7827; H01L 29/66666; H01L 29/8083
USPC .......................... 257/329–333, 341
See application file for complete search history.

(56) References Cited

U.S. PATENT DOCUMENTS 4,219,835 A * 8/1980 van Loon et al. ............. 257/330
4,250,519 A * 2/1981 Mogi et al. ................... 257/302
(Continued)

FOREIGN PATENT DOCUMENTS

EP   1737044 A   12/2006
EP   2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

Primary Examiner — S. V. Clark
Assistant Examiner — Ali Naraghi
(74) Attorney, Agent, or Firm — Eric J. Robinson; Robinson Intellectual Property Law Office, P.C.

(57) ABSTRACT

A transistor used for a semiconductor device for high power application needs to have a channel region for obtaining higher drain current. As an example of such a transistor, a vertical (trench type) transistor has been considered; however, the vertical transistor cannot have a high on/off ratio of drain current and thus cannot have favorable transistor characteristics. Over a substrate having conductivity, an oxide semiconductor layer having a surface having a dotted pattern of a plurality of island-shaped regions with a tapered shape in a cross section is sandwiched between a first electrode formed between the substrate and the oxide semiconductor layer and a second electrode formed over the oxide semiconductor layer, and a conductive layer functioning as a gate electrode is formed on the side surface of the island-shaped region in the oxide semiconductor layer with an insulating layer provided therebetween.

20 Claims, 15 Drawing Sheets

(56) References Cited

U.S. PATENT DOCUMENTS

| | | | |
|---|---|---|---|
| 4,271,418 A * | 6/1981 | Hiltpold | 257/302 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,720,617 B2 * | 4/2004 | Einav | 257/332 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,429,823 B2 | 9/2008 | Yamamoto et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 8,053,320 B2 * | 11/2011 | Hayashi et al. | 438/289 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0278122 A1 | 11/2009 | Hosono et al. | |
| 2009/0280600 A1 | 11/2009 | Hosono et al. | |
| 2009/0315590 A1 * | 12/2009 | Yin et al. | 326/119 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0219462 A1 * | 9/2010 | Darwish et al. | 257/329 |
| 2011/0101337 A1 | 5/2011 | Yamazaki | |
| 2011/0101356 A1 | 5/2011 | Yamazaki | |
| 2011/0121284 A1 | 5/2011 | Yamazaki et al. | |
| 2011/0121288 A1 | 5/2011 | Yamazaki et al. | |
| 2011/0127522 A1 | 6/2011 | Yamazaki | |
| 2011/0127526 A1 | 6/2011 | Kawae et al. | |
| 2012/0043542 A1 | 2/2012 | Yanagisawa | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-296378 | 12/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-110110 | 4/2003 |
| JP | 2003-298062 | 10/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| WO | WO-2004/114391 | 12/2004 |
| WO | WO 2006/051993 | 5/2006 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semicon-

(56) References Cited

OTHER PUBLICATIONS ductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and SN-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emissing AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe$_2$O$_4$, andYb$_2$Fe$_3$O$_7$ Types of Structures for Compounds in the In$_2$O$_3$ and Sc$_2$O$_3$—A$_2$O$_3$—BO Systems [A; Fe, Ga, or Al; B: Mg, Mn, Fe, Ni, Cu,or Zn]at Temperatures over 1000° C.", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO$_4$,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review, B), 2008, vol. 77, pp. 245202-1-245202-6.

Orita.M et al., "Amorphous transparent conductive oxide InGaO$_3$(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE

BACKGROUND OF THE INVENTION

1. Field of the Invention

The technical field of the present invention relates to a semiconductor device using an oxide semiconductor. In particular, the technical field of the present invention relates to a semiconductor device including a transistor using an oxide semiconductor.

In this specification, a semiconductor device generally means a device which can function by utilizing semiconductor characteristics, and an electrooptic device, a semiconductor circuit, and electronic equipment are all semiconductor devices.

2. Description of the Related Art

Transistors which are used for many liquid crystal display devices and light-emitting display devices typified by flat panel displays have been formed over glass substrates and using a silicon semiconductor such as amorphous silicon or polycrystalline silicon.

Instead of the silicon semiconductor, a technique in which an oxide semiconductor is used for transistors has attracted attention.

Examples of the oxide semiconductor include zinc oxide, which is one-metal oxide, and In—Ga—Zn-based oxide, which is a homologous compound. Patent Documents 1 and 2 disclose techniques in which such an oxide semiconductor is used to form transistors as switching elements and the like in pixels of a display device.

REFERENCE

Patent Document

[Patent Document 1] Japanese Published Patent Application No. 2007-123861
[Patent Document 2] Japanese Published Patent Application No. 2007-096055

SUMMARY OF THE INVENTION

A bottom gate transistor used for the switching element, for example, of the display device is a lateral transistor. The lateral transistor has a thin channel region to be a path of the drain current, and is therefore difficult to be applied to a semiconductor device for high power application. Accordingly, a transistor used for a semiconductor device for high power application preferably has a structure for obtaining higher drain current.

Further, as a transistor used for a semiconductor device for high power application, a vertical (trench type) transistor has been considered. However, there is a problem in that the vertical transistor using silicon cannot have a high on/off ratio of drain current and thus cannot have favorable transistor characteristics.

One embodiment of the present invention is a semiconductor device including a conductive substrate, a first conductive layer formed over the substrate, a second conductive layer formed over the first conductive layer, an oxide semiconductor layer provided over the second conductive layer, the oxide semiconductor layer having a surface having a dotted pattern of a plurality of island-shaped regions with a tapered shape in a cross section, a third conductive layer formed over a top surface of the island-shaped regions in the oxide semiconductor layer, a first insulating layer formed over the oxide semiconductor layer and the third conductive layer, the first insulating layer having a function of a gate insulating layer, a fourth conductive layer formed over a side surface of the island-shaped regions in the oxide semiconductor layer with the first insulating layer provided therebetween, the fourth conductive layer having a function of a gate electrode, a second insulating layer formed over the first insulating layer and the fourth conductive layer, the second insulating layer having a function of an interlayer insulating layer, and a fifth conductive layer formed over the third conductive layer with the first insulating layer and the second insulating layer provided therebetween, and connected to the third conductive layer through an opening portion provided in the first insulating layer and the second insulating layer.

In the semiconductor device according to one embodiment of the present invention, it is preferable that the oxide semiconductor layer between the island-shaped regions adjacent to each other is overlapped with the fourth conductive layer with the first insulating layer provided therebetween in the oxide semiconductor layer.

In the semiconductor device according to one embodiment of the present invention, it is preferable that the third conductive layer between the island-shaped regions adjacent to each other is overlapped with the second insulating layer with the first insulating layer provided therebetween in the oxide semiconductor layer.

In the semiconductor device according to one embodiment of the present invention, it is preferable that the fourth conductive layer is connected to each other.

In the semiconductor device according to one embodiment of the present invention, it is preferable that the fifth conductive layer is connected to each other.

In the semiconductor device according to one embodiment of the present invention, it is preferable that the second conductive layer and the third conductive layer include an oxide semiconductor layer including phosphorus or boron.

In the semiconductor device according to one embodiment of the present invention, it is preferable that the first conductive layer include tungsten.

Further, another embodiment of the present invention is a semiconductor device including a conductive substrate, a first conductive layer formed over the substrate, an oxide semiconductor layer provided over the second conductive layer, the oxide semiconductor layer having a surface having a dotted pattern of a plurality of island-shaped regions with a tapered shape in a cross section, a second conductive layer formed over a top surface of the island-shaped region in the oxide semiconductor layer, a first insulating layer formed over the oxide semiconductor layer and the second conductive layer, the first insulating layer having a function of a gate insulating layer, a third conductive layer formed over a side surface of the island-shaped region in the oxide semiconductor layer with the first insulating layer provided therebetween, the third conductive layer having a function of a gate electrode, a second insulating layer formed over the first insulating layer and the third conductive layer, the second insulating layer having a function of an interlayer insulating layer, and a fourth conductive layer formed over the second conductive layer with the first insulating layer and the second insulating layer provided therebetween and connected to the second conductive layer through an opening portion provided in the first insulating layer and the second insulating layer.

In the semiconductor device according to one embodiment of the present invention, it is preferable that the oxide semiconductor layer between the island-shaped regions adjacent to each other is overlapped with the third conductive layer with the first insulating layer provided therebetween in the oxide semiconductor layer.

In the semiconductor device according to one embodiment of the present invention, it is preferable that the third conductive layer is connected to each other.

In the semiconductor device according to one embodiment of the present invention, it is preferable that the fourth conductive layer is connected to each other.

In the semiconductor device according to one embodiment of the present invention, it is preferable that the second conductive layer includes an oxide semiconductor layer including phosphorus or boron.

In the semiconductor device according to one embodiment of the present invention, it is preferable that the first conductive layer includes tungsten.

Further, another embodiment of the present invention is a semiconductor device including a substrate having conductivity, a first conductive layer formed over the substrate, a second conductive layer formed over the first conductive layer, an oxide semiconductor layer provided over the second conductive layer, the oxide semiconductor layer having a surface having a dotted pattern of a plurality of island-shaped regions with a tapered shape in a cross section, a third conductive layer formed over a top surface of the island-shaped region in the oxide semiconductor layer, an insulating layer formed over the oxide semiconductor layer and the third conductive layer, the insulating layer having a function of a gate insulating layer, and a fourth conductive layer forming a conductive layer formed over a side surface of the island-shaped region in the oxide semiconductor layer with the insulating layer provided therebetween and having a function of a gate electrode, and a conductive layer formed over the third conductive layer with the insulating layer provided therebetween and connected to the third conductive layer through an opening portion provided in the insulating layer.

In the semiconductor device according to one embodiment of the present invention, it is preferable that the oxide semiconductor layer between the island-shaped regions adjacent to each other in the oxide semiconductor layer is overlapped with the fourth conductive layer functioning as a gate electrode with the first insulating layer provided therebetween.

In the semiconductor device according to one embodiment of the present invention, it is preferable that the fourth conductive layer each functioning as a gate electrode is connected to each other.

In the semiconductor device according to one embodiment of the present invention, it is preferable that the fourth conductive layers connected to the third conductive layer through an opening portion provided in the insulating layer are connected to each other.

In the semiconductor device according to one embodiment of the present invention, it is preferable that the second conductive layer and the third conductive layer are conductive layers including an oxide semiconductor layer including phosphorus or boron.

In the semiconductor device according to one embodiment of the present invention, it is preferable that the first conductive layer is a conductive layer including tungsten.

Another embodiment of the present invention is a semiconductor device including an oxide semiconductor layer having one surface having a projection and a depression, an insulating layer formed in contact with a surface of the depression, the insulating layer functioning as a gate insulating layer, a first conductive layer formed on and in contact with the insulating layer, the first conductive layer functioning as a gate electrode, a second conductive layer formed in contact with a top surface of the projection, the second conductive layer functioning as a low-resistance region, a third conductive layer formed in contact with the other surface of the oxide semiconductor layer, the third conductive layer functioning as a low-resistance region, a fourth conductive layer having a flat surface on which the third conductive layer is formed, and a substrate having conductivity, the substrate having a flat surface on which the fourth conductive layer is formed.

In the semiconductor device according to one embodiment of the present invention, it is preferable that the third conductive layer is formed to be exposed on a surface of the depression.

The semiconductor device which is one embodiment of the present invention can have favorable transistor characteristics and obtain higher drain current. Moreover, in a semiconductor device which is one embodiment of the present invention, output current per unit area can be increased by connecting a plurality of devices in parallel to each other. Further, in the semiconductor device which is one embodiment of the present invention, by using a metal substrate having high thermal conductivity as a substrate over which a transistor is formed, a heat radiation function can be improved.

DETAILED DESCRIPTION OF THE INVENTION

Figure 1A:
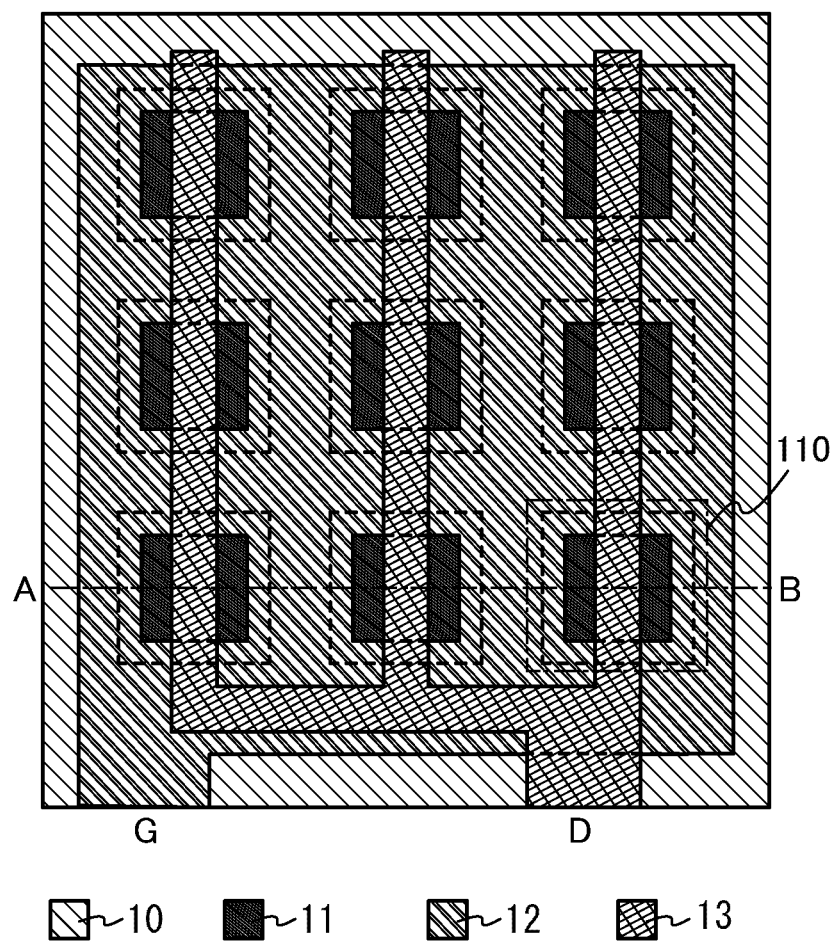
FIG. 1A and FIG. 1B are a top view and a cross-sectional view illustrating one embodiment of the present invention.

Embodiments of the present invention are described below with reference to the drawings. However, the present invention can be carried out in many different modes, and those skilled in the art could appreciate that a variety of modifications can be made to the embodiment and details of the present invention without departing from the spirit and scope of the present invention. Accordingly, the present invention is not construed as being limited to the described content of the embodiments included herein. Note that in the structures of the present invention described below, reference numerals denoting the same portions are used in common in different drawings.

Note that the size, the thickness of a layer, signal waveform, and a region of each structure illustrated in the drawings and the like in the embodiments are exaggerated for simplicity in some cases. Therefore, embodiments of the present invention are not limited to such scales.

Note that in this specification, the terms "first", "second", "third", to "N-th" (N is a natural number) are used in order to avoid confusion among components and do not limit the number of components.

Functions of a "source" and a "drain" are sometimes replaced with each other when the direction of current flowing is changed in circuit operation, for example. Therefore, the terms "source" and "drain" can be used to denote the drain and the source, respectively, in this specification.

The term "on-state current" refers to current which flows between a source electrode and a drain electrode when a transistor is on. For example, in the case of an n-channel transistor, the on-state current refers to current which flows between the source electrode and the drain electrode when a gate voltage of the transistor is higher than a threshold voltage thereof. In addition, the term "off-state current" refers to current which flows between a source electrode and a drain electrode when a transistor is off.

(Embodiment 1)

In this embodiment, a semiconductor device which is one embodiment of the present invention is described with reference to a top view and a cross-sectional view.

Figure 1B:
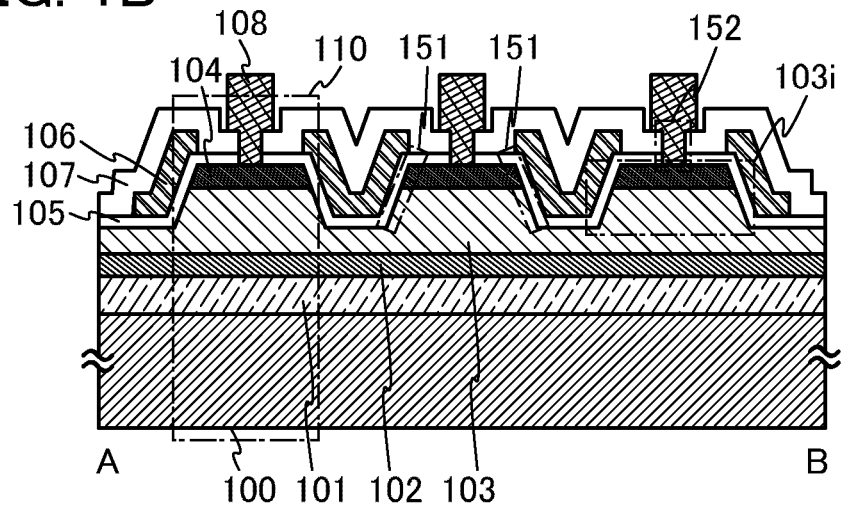

FIG. 1A is a top view of a semiconductor device including a transistor 110, and FIG. 1B is a cross-sectional view taken along line A-B of FIG. 1A.

FIG. 1A is a top view of the case where a plurality of conductive layers, a plurality of insulating layers, and an oxide semiconductor layer are stacked over a substrate. In FIG. 1A, in particular, a layout diagram of an oxide semiconductor layer 10, a conductive layer 11, a conductive layer 12, and a conductive layer 13 is shown. Note that in FIG. 1A, an insulating layer is not illustrated. Further, in FIG. 1A, a portion where the conductive layers are overlapped with the oxide layer when seen from above is surrounded by a dotted line.

In FIG. 1A, the plurality of transistors 110 is provided in a dot pattern over the substrate. Though an example in which the number of transistors 110 provided over the substrate is 3×3 is shown in FIG. 1A, the number of transistors is preferably greater than or equal to 10 and less than or equal to 10000 as an example. In the semiconductor device which is one embodiment of the present invention, the sum of the amount of current which flows through each transistor 110 is the amount of current which can flow through the semiconductor device. Therefore, even if the amount of current which flows through each transistor 110 is not enough, by increasing the number of transistors included in the semiconductor device, the amount of current which flows through the semiconductor device can be increased.

Note that providing the plurality of transistors 110 to make a dot-pattern means that the transistors 110 may be arranged in a matrix in a plane pattern as illustrated in FIG. 1A, or in a zigzag manner. In particular, by arranging the transistors 110 in a matrix, a layout area of a wiring led in the semiconductor device can be reduced. Moreover, by arranging the transistors 110 in a matrix, the transistors 110 having the same size can be provided side by side, leading to suppression in variation in characteristics among transistors.

In addition, in FIG. 1A, the conductive layer 12 is provided in a grid to be connected to the plurality of transistors 110 as an example. The conductive layer 12 can function as a gate electrode of the transistor 110. The conductive layer 12 can be extended and connected to a terminal connected to an external element. Note that in FIG. 1A, a terminal G which is connected to gates of the plurality of transistors 110 to be connected to an external element is shown.

Further, in FIG. 1A, the conductive layer 13 is provided to be connected to each transistor 110 as an example. The conductive layer 13 can function as an electrode which is connected to a region functioning as a source or a drain of the transistor 110. The conductive layer 13 can be connected to a terminal connected to an external element. Note that in FIG. 1A, a terminal D which is connected to drains (or sources) of the plurality of transistors 110 to be connected to an external element is shown.

Next, a cross-sectional view of the transistor 110 is described with reference to FIG. 1B.

The cross-sectional view in FIG. 1B illustrates a structure example in which three transistors 110 each including a substrate 100, a conductive layer 101, a conductive layer 102, an oxide semiconductor layer 103, a conductive layer 104, an insulating layer 105, a conductive layer 106, an insulating layer 107, and a conductive layer 108 are arranged.

In FIG. 1B, in the oxide semiconductor layer 103, not only a region provided on and in contact with the conductive layer 102, but also a plurality of island-shaped regions 103i provided on a surface at a side in contact with the insulating layer 105 is shown. Further, in FIG. 1B, each island-shaped region 103i has tapered shapes 151 on the side surface in its cross-sectional view.

With a structure of the transistors 110 like the cross-sectional view illustrated in FIG. 1B, a potential applied to the conductive layer 106 can control the amount of the current which flows through the oxide semiconductor layer in the region provided over and in contact with the conductive layer 102 and the oxide semiconductor layer in the island-shaped region 103i. Therefore, a leakage current in the case where a high voltage is applied to the transistor 110 can be reduced by simple design change of increasing the thickness of the oxide semiconductor in the region provided over and in contact with the conductive layer 102.

In FIG. 1B, an opening portion 152 (a contact hole) is provided through the insulating layer 105 and the insulating layer 107. In the opening portion 152, the conductive layer 104 is connected to the conductive layer 108.

As the substrate 100, a conductive substrate, for example, a metal substrate is used. The metal substrate is preferably a material having high electric conductivity and high thermal conductivity. A stainless steel substrate or a copper substrate is preferably used as the substrate 100.

Accordingly, the substrate 100 in this embodiment can have a heat radiation function. As illustrated in FIG. 1A, the plurality of transistors 110 is provided over the substrate 100 having a heat radiation function. In the case where heat is generated by current which flows through the plurality of transistors 110, the substrate 100 can release the generated heat outside efficiently.

By extending the substrate 100 outside, the heat radiation function of the substrate 100 can be increased. For example, as a perspective view of FIG. 2, the substrate 100 provided with the transistor 110 may extend to the outside of a housing 200.

Figure 2:
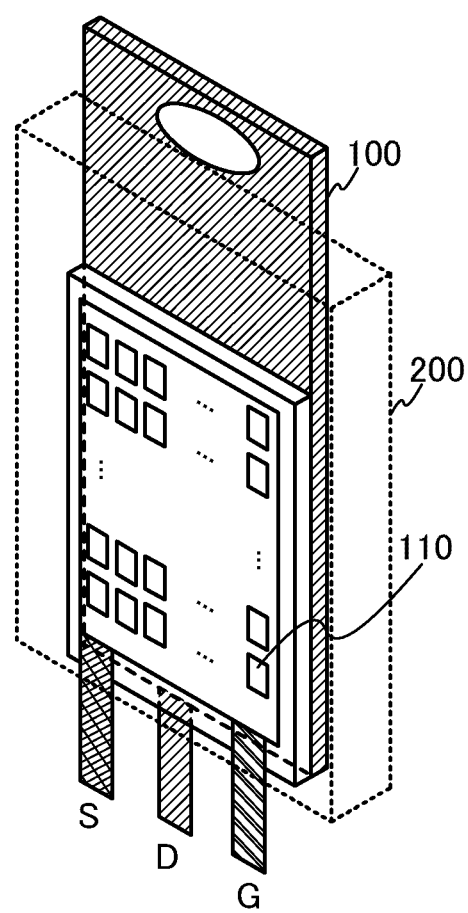
FIG. 2 is a perspective view illustrating one embodiment of the present invention.

As illustrated in FIG. 2, not only the terminal D and the terminal G illustrated in FIG. 1A, but also part of the substrate 100 can be extended to the outside of the housing to be connected to the external element. In this case, an electrode extended from the substrate 100 can be used as a terminal S which is connected to a source (or a drain) of the plurality of transistors 110.

As the conductive layer 101, a conductive material may be used. The conductive layer 101 functions as an electrode (referred to as a first electrode) which is connected to a region functioning as one of a source and a drain of the transistor 110. As the conductive layer 101, tungsten (W) whose heat resistance is relatively high is preferably used.

As the conductive layer 102, a conductive material may be used. The conductive layer 102 functions as a low-resistance region which suppresses deterioration of the transistor 110 due to hot carriers and the like by an electric field which is applied to the transistor 110. As the conductive layer 102, it is preferable to use a layer whose conductivity is increased by injecting phosphorus (P) or boron (B) as a dopant into the oxide semiconductor layer by an ion implantation method or an ion doping method.

As the dopant injected into the oxide semiconductor layer, a rare gas such as helium, argon, or xenon, a Group 15 element such as nitrogen, phosphorus, arsenic, or antimony, or the like can be alternatively used.

A material of an oxide semiconductor layer to which a dopant is injected preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, lanthanoid can be used; for example, one or plural kinds of lanthanum (La), cerium (Ce), neodymium (Nd), gadolinium (Gd), ytterbium (Yb), and the like may be contained.

As the material of the oxide semiconductor layer, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

For the oxide semiconductor layer 103, an oxide semiconductor material functioning as a channel formation region may be used. For the oxide semiconductor layer 103, the metal oxide given in the description of the conductive layer 102 can be used.

In particular, for the oxide semiconductor layer 103, an In—Ga—Zn-based oxide is preferably used. The In—Ga—Zn-based oxide has sufficiently high resistance when there is no electric field and thus off-state current can be sufficiently reduced. In addition, also having high field-effect mobility, the In—Ga—Zn-based oxide is suitable for a semiconductor material used in a semiconductor device. The drain breakdown voltage depends on the thickness of the oxide semiconductor layer. For this reason, it is preferable to set the thickness of the oxide semiconductor layer large in order to increase the drain breakdown voltage, and it is possible to select the film thickness suitable for a desired drain breakdown voltage. For example, the thickness of the oxide semiconductor layer 103 is preferably greater than or equal to 3 μm and less than or equal to 4 μm.

Note that for the oxide semiconductor layer 103, another material of the above In—Ga—Zn-based oxide can be used. For example, In—Zn-based oxide and In—Sn—Zn-based metal oxide are preferably used, because such an oxide enables the field-effect mobility of the transistor 110 to be larger than that of the transistor 110 instead using an In—Ga—Zn-based oxide.

The oxide semiconductor layer 103 can be single crystal, polycrystalline (also referred to as polycrystal), or amorphous, for example.

Preferably, a CAAC-OS (c-axis aligned crystalline oxide semiconductor) film can be used as the oxide semiconductor film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that the oxide semiconductor layer 103 is preferably formed over a planar surface. Specifically, the oxide semiconductor may be formed over a surface with the average surface roughness (Ra) of less than or equal to 1 nm, preferably less than or equal to 0.3 nm, more preferably less than or equal to 0.1 nm.

Note that $R_a$ is obtained by expanding arithmetic mean deviation, which is defined by JIS B 0601, into three dimensions so as to be applicable to a surface. Moreover, $R_a$ can be expressed as average value of the absolute values of deviations from a reference surface to a specific surface and is defined by the following Formula 1.

$$Ra = \frac{1}{S_0} \int_{y_1}^{y_2} \int_{x_1}^{x_2} |f(x, y) - Z_0| dx dy \qquad \text{[FORMULA 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

Moreover, the oxide semiconductor layer 103 is preferably highly purified by sufficient removal of impurities such as hydrogen and supplied with oxygen sufficiently. Specifically, the hydrogen concentration in the oxide semiconductor layer 103 is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$, for example. Note that the hydrogen concentration in the oxide semiconductor layer 103 is measured by SIMS (secondary ion mass spectrometry). In the oxide semiconductor layer 103 which is highly purified by a sufficient reduction in hydrogen concentration and in which defect levels in the energy gap due to oxygen deficiency are reduced by a sufficient supply of oxygen, the density of carriers generated due to a donor such as hydrogen is greater than or equal to $1 \times 10^{10}$/cm$^3$ and less than or equal to $1 \times 10^{13}$/cm$^3$. In this manner, by using the i-type (intrinsic) or substantially i-type oxide semiconductor, the transistor 110 with extremely low off-state current can be obtained.

The oxide semiconductor layer 103 serving as a channel formation region preferably has the shape in which the length in the out-of-plane direction is preferably larger than the length in the in-plane direction. In the oxide semiconductor that is i-type (intrinsic) or substantially i-type and has a carrier density, which depends on donors such as hydrogen, of less than or equal to $1 \times 10^{13}$/cm$^3$, by increasing the thickness of the oxide semiconductor layer, electric characteristics of the transistor, such as on/off ratio of drain current can be made better. This is because a sufficient depletion layer is formed in the oxide semiconductor layer 103 by making the length in the out-of-plane direction of the oxide semiconductor layer 103 larger than the length in the in-plain direction.

As the conductive layer 104, a conductive material may be used. The conductive layer 104 functions as an electrode (referred to as a second electrode) which is connected to a region functioning as the other of the source and the drain of the transistor 110. Therefore, as the conductive layer 104, tungsten (W) whose heat resistance is relatively high is preferably used similar to the conductive layer 101.

The conductive layer 104, similar to the conductive layer 102, may function as a low-resistance region which suppresses deterioration of the transistor 110 due to hot carriers and the like by an electric field which is applied to the transistor 110. Therefore, as the conductive layer 104, similar to the conductive layer 102, it is preferable to use a layer whose conductivity is increased by injecting phosphorus (P) or boron (B) as a dopant into the oxide semiconductor layer by an ion implantation method or an ion doping method.

Alternatively, the above layer functioning as a low-resistance region and a layer functioning as a second electrode may be stacked to form. Further, the conductive layer 104 and another conductive layer may be stacked. As an example, from a side which is in contact with the oxide semiconductor layer 103, the layer functioning as a low-resistance region and tungsten (W) having a relatively high heat resistance may be stacked in this order.

Note that in one embodiment of the present invention, as illustrated in FIG. 1B, the oxide semiconductor layer 103 on which the conductive layer 104 is stacked includes the island-shaped region 103i whose side surface has the tapered shape 151 in its cross section.

The insulating layer 105 functions as a gate insulating layer. For the insulating layer 105, an insulating material which is a high-k material is preferably used. Specifically, as the insulating layer 105, silicon oxide, zirconium oxide, or hafnium oxide is preferably used.

Further, the insulating layer 105 may have a single-layer structure or a stacked structure. Use of a high-k material for the insulating layer 105 enables a reduction in gate leakage current. Note that a portion of the insulating layer 105 which is in contact with the oxide semiconductor layer 103 preferably contains oxygen, and in particular, the portion of the insulating layer 105 is preferably formed using a silicon oxide film. Therefore, by using an insulating layer having a structure in which silicon oxide and zirconium oxide are stacked in this order, or a structure in which silicon oxide and hafnium oxide are stacked in this order, oxygen can be supplied to the oxide semiconductor layer 103 to make transistor characteristics favorable.

As the conductive layer 106, a conductive material may be used. The conductive layer 106 functions as an electrode functioning as a gate of the transistor 110. The conductive layer 106 can be formed using a metal element selected from aluminum, chromium, copper, tantalum, titanium, molybdenum, tungsten, and yttrium; an alloy containing any of these metal elements as a component; an alloy containing any of these metal elements in combination; or the like can be used. In addition, the conductive layer 106 can have a single-layer structure or a stacked structure having two or more layers. Note that for the conductive layer 106, a material having high heat resistance and high conductivity is preferably selected.

The insulating layer 107 serves as an interlayer insulating layer. The same material as the insulating layer 105 can be used for the insulating layer 107.

The conductive layer 108 is a layer for electrically connecting respective second electrodes of the transistors 110 to each other. Therefore, the conductive layer 108 is formed using a conductive material; for example, the same material as the conductive layer 106 can be used. Note that the conductive layer 108 is connected to the conductive layer 104 through the opening portion 152 formed in the insulating layer 105 and the insulating layer 107. The length to wire the conductive layer 108 is longer than that of the other conductive layers, because the conductive layer 108 is a layer for electrically connecting the transistors 110 to each other. Therefore, the conductive layer 108 is preferably formed using copper (Cu) whose conductivity is high. More preferably, the conductive layer 108 is formed using tungsten and copper which is stacked over the tungsten.

As described above, the semiconductor device in one embodiment of the present invention has a structure including the plurality of transistors 110 over the substrate 100 as illustrated in FIG. 1B. The transistor 110 includes the oxide semiconductor layer 103 functioning as a channel formation region between the conductive layer 101 which functions as the first electrode and the conductive layer 104 which functions as the second electrode. The amount of the current through the transistor 110 is controlled by application of a voltage to the conductive layer 106 with the insulating layer 105 provided therebetween. The transistor 110 is a vertical (trench) transistor in which the channel formation region is formed in the thickness vertical direction and drain current flows between the first electrode and the second electrode in the thickness vertical direction.

The transistor 110 illustrated in FIG. 1B is annularly surrounded with the conductive layer 106 functioning as a gate, so that drain current can be ensured efficiently. Accordingly, high drain current can be generated. Further, the plurality of first electrodes of the transistors 110 provided over the substrate 100 are connected to each other and the plurality of second electrodes of the transistors 110 provided over the substrate 100 are connected to each other, realizing a structure in which the transistors are electrically connected to each other in parallel and increasing the sum of the current which flows through the transistor 110, whereby the output current which the semiconductor device can flow can be increased.

The drain withstand voltage of the transistor 110 using an oxide semiconductor for a channel formation region is now described.

When the electric field in the semiconductor reaches a certain threshold value, impact ionization occurs, carriers accelerated by the high electric field impact crystal lattices in a depletion layer, thereby generating pairs of electrons and holes. When the electric field becomes even higher, the pairs of electrons and holes generated by the impact ionization are further accelerated by the electric field, and the impact ionization is repeated, resulting in an avalanche breakdown in which current is increased exponentially. The impact ionization occurs because carriers (electrons and holes) have kinetic energy that is larger than or equal to the band gap of the semiconductor. It is known that the impact ionization coefficient that shows probability of impact ionization has correlation with the band gap and that the impact ionization is unlikely to occur as the band gap is increased.

Since the band gap of the oxide semiconductor is 3.15 eV, which is larger than the band gap of silicon, 1.12 eV, the avalanche breakdown is expected to be unlikely to occur. Therefore, a transistor including an oxide semiconductor has a high drain breakdown voltage, so that on-state current does not easily increase sharply in an exponential manner even when a high electric field is applied.

Next, hot-carrier degradation of a transistor using an oxide semiconductor is described.

The hot-carrier degradation means deterioration of transistor characteristics, e.g., shift in the threshold voltage or gate leakage current, which is caused as follows: electrons that are accelerated to be rapid are injected in the vicinity of a drain in a channel into a gate insulating film and become fixed electric charge or form trap levels at the interface between the gate insulating film and the oxide semiconductor. The factors of the hot-carrier degradation are, for example, channel-hot-electron injection (CHE injection) and drain-avalanche-hot-carrier injection (DAHC injection).

Since the band gap of silicon is narrow, electrons are likely to be generated like an avalanche owing to an avalanche breakdown, and electrons that are accelerated to be so rapid as to go over a barrier to the gate insulating film are increased in number. However, the oxide semiconductor described in this embodiment has a wide band gap; therefore, the avalanche breakdown is unlikely to occur and resistance to the hot-carrier degradation is higher than that of silicon. For this reason, it can be said that a transistor using the oxide semiconductor in this specification has a high drain breakdown voltage. Therefore, such a transistor is suitable for a power device such as an insulated-gate field-effect transistor (IGFET).

Next, a manufacturing process of the transistor 110 described in FIGS. 1A and 1B is described with reference to FIGS. 3A and 3B, FIGS. 4A and 4B, FIGS. 5A and 5B, FIGS. 6A and 6B, FIGS. 7A and 7B, FIGS. 8A and 8B, and FIGS. 9A and 9B. In FIGS. 3A and 3B, FIGS. 4A and 4B, FIGS. 5A and 5B, FIGS. 6A and 6B, FIGS. 7A and 7B, FIGS. 8A and 8B, and FIGS. 9A and 9B, a manufacturing process of the transistor 110 is described with reference to top views and their cross-sectional views.

Figure 3A:
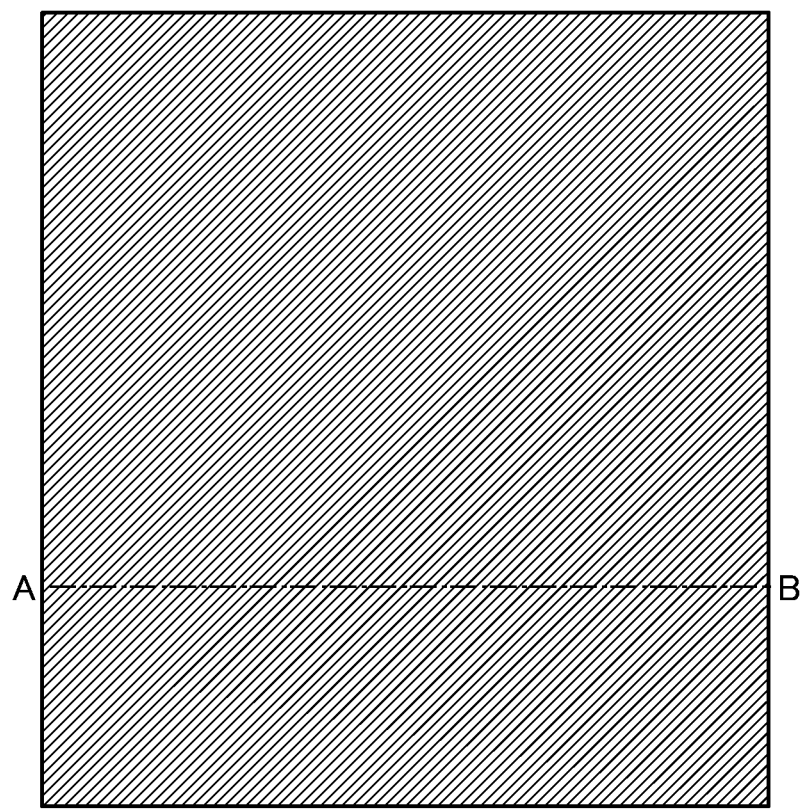
FIG. 3A and FIG. 3B are a top view and a cross-sectional view illustrating one embodiment of the present invention.
Figure 3B:
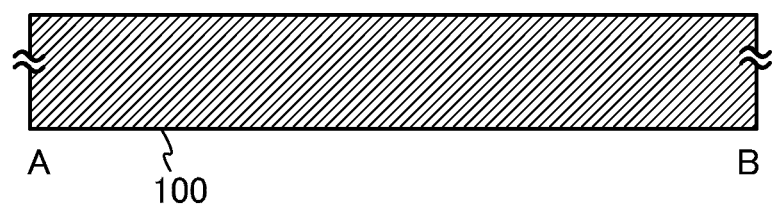

First, FIG. 3A is a top view of the substrate 100. FIG. 3B is a cross-sectional view taken along dashed-dotted line A-B in the top view in FIG. 3A.

As the substrate 100, as described with reference to FIG. 1B, a stainless steel substrate or a copper substrate is preferably used. Note that the substrate 100 preferably has a flat surface. Specifically, the average surface roughness (Ra) of the conductive layer 102 over which the oxide semiconductor layer 103 is formed is preferably less than or equal to 1 nm, more preferably less than or equal to 0.3 nm, still more preferably less than or equal to 0.1 nm. The flat surface can be obtained by performing a planarization step such as CMP (chemical mechanical polish) or the like on a surface of the substrate 100.

Figure 4A:
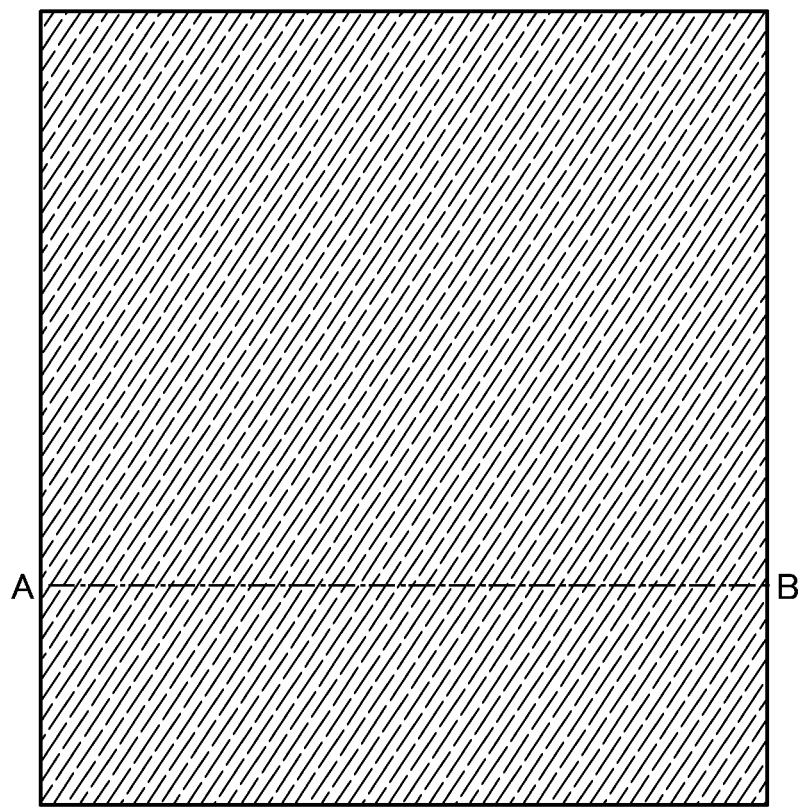
FIG. 4A and FIG. 4B are a top view and a cross-sectional view illustrating one embodiment of the present invention.
Figure 4B:
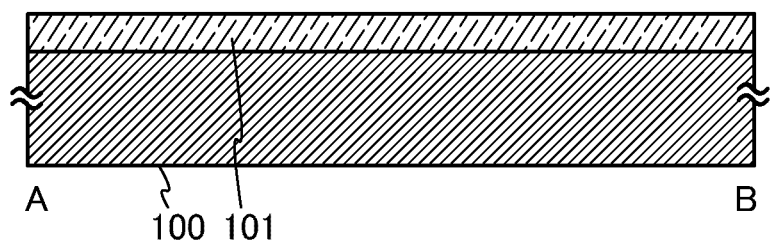

Next, the conductive layer 101 is formed over the substrate 100. FIG. 4A is a top view in which the conductive layer 101 is formed over the substrate 100. FIG. 4B is a cross-sectional view taken along dashed-dotted line A-B in the top view in FIG. 4A.

The conductive layer 101 is formed over the substrate 100 by a sputtering method which is a physical vapor deposition (PVD) method, a vacuum deposition method, or a chemical vapor deposition (CVD) method. Note that the conductive layer 101 preferably has a flat surface. Specifically, the average surface roughness (Ra) of the conductive layer 102 over which the oxide semiconductor layer 103 is formed is preferably less than or equal to 1 nm, more preferably less than or equal to 0.3 nm, still more preferably less than or equal to 0.1 nm. The flat surface can be obtained by performing a planarization step such as CMP (chemical mechanical polish) or the like on the surface of the conductive layer 101.

As the conductive layer 101, as described in FIG. 1B, tungsten (W) whose heat resistance is relatively high is preferably used.

Figure 5A:
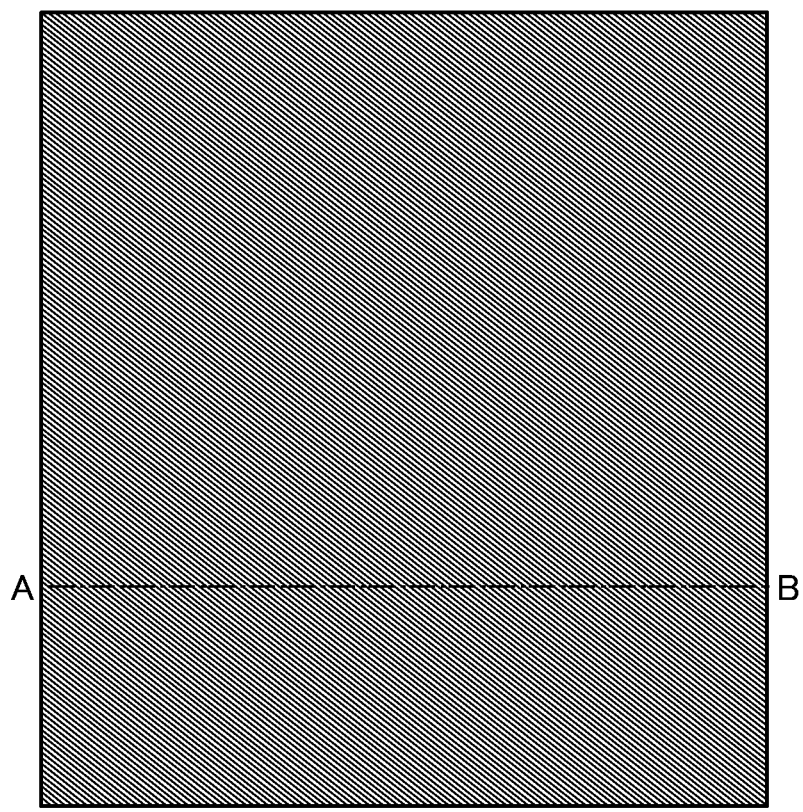
FIG. 5A and FIG. 5B are a top view and a cross-sectional view illustrating one embodiment of the present invention.
Figure 5B:
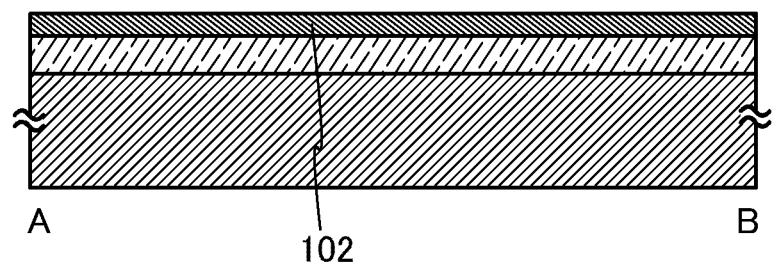

Then, the conductive layer 102 is formed over the conductive layer 101. FIG. 5A is a top view in which the conductive layer 102 is formed over the conductive layer 101. FIG. 5B is a cross-sectional view taken along dashed-dotted line A-B in the top view in FIG. 5A.

The conductive layer 102 can be formed by forming an oxide semiconductor layer over the conductive layer 101 by a sputtering method, a coating method, a printing method, or the like, and then, injecting dopant for a low-resistance region to the oxide semiconductor layer by an ion implantation method or an ion doping method. That is, the conductive layer 102 is a low-resistance region made of a low-resistance oxide semiconductor layer. Note that the conductive layer 102 preferably has a flat surface. Specifically, the conductive layer 102 is preferably formed over the surface whose average surface roughness (Ra) is less than or equal to 1 nm, preferably less than or equal to 0.3 nm, more preferably less than or equal to 0.1 nm. The flat surface can be obtained by performing a planarization step such as CMP (chemical mechanical polish) or the like on a surface of the conductive layer 102.

Figure 6A:
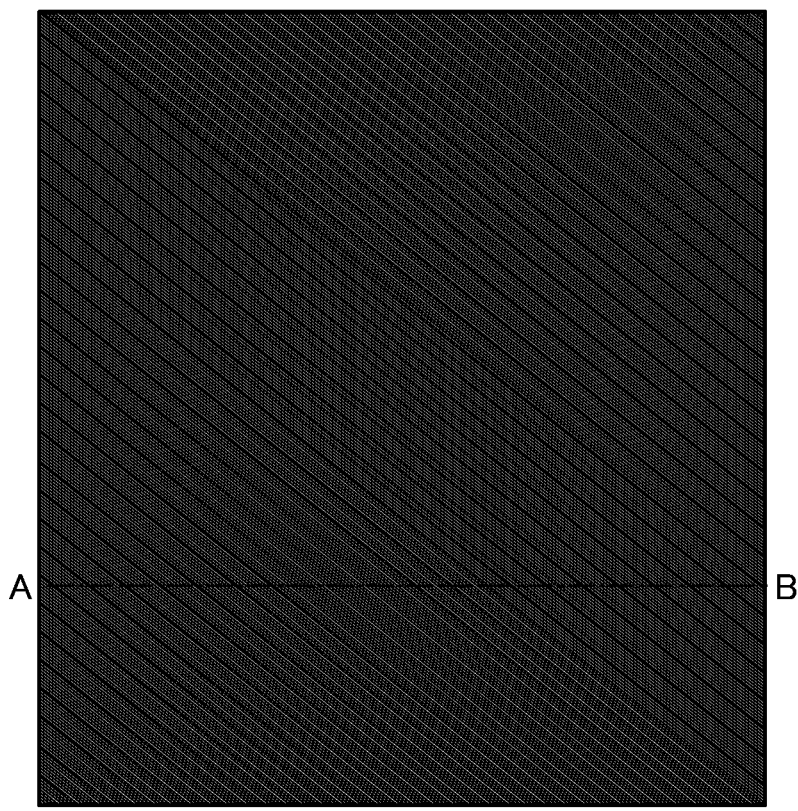
FIG. 6A and FIG. 6B are a top view and a cross-sectional view illustrating one embodiment of the present invention.
Figure 6B:
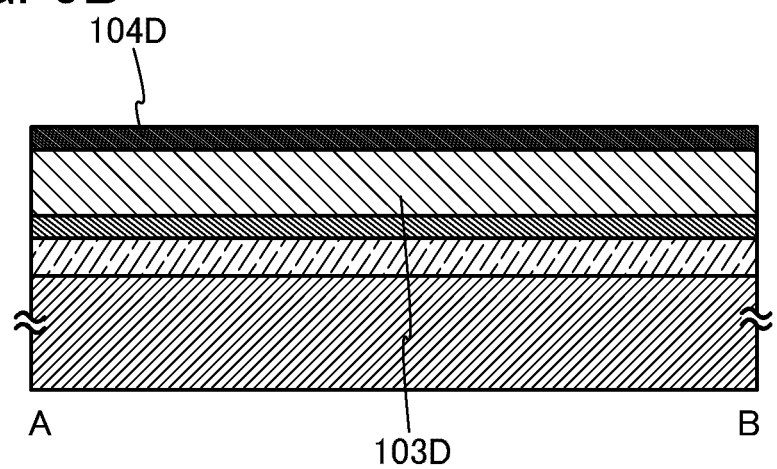

Next, an oxide semiconductor layer 103D is formed over the conductive layer 102. In addition, a conductive layer 104D is formed over the oxide semiconductor layer 103D. FIG. 6A is a top view in which the oxide semiconductor layer 103D and the conductive layer 104D over the oxide semiconductor layer 103D are formed. FIG. 6B is a cross-sectional view taken along dashed-dotted line A-B in the top view in FIG. 6A.

Note that the oxide semiconductor layer 103D and the conductive layer 104D described in FIGS. 6A and 6B correspond to the oxide semiconductor layer 103 and the conductive layer 104 before being processed into the island-shaped illustrated in FIG. 1B. That is, the oxide semiconductor layer 103D and the conductive layer 104D become the oxide semiconductor layer 103 and the conductive layer 104 in a later step. Therefore, in the drawings, the oxide semiconductor layer 103 is hatched like the oxide semiconductor layer 103D, and the conductive layer 104 is hatched like the conductive layer 104D.

The oxide semiconductor layer 103D is formed over the conductive layer 102 by a sputtering method, a coating method, a printing method, or the like. Then, the conductive layer 104D is formed over the oxide semiconductor layer 103D.

Note that as the conductive layer 104D, tungsten similar to the conductive layer 101, or a low-resistance region made of a low-resistance oxide semiconductor layer similar to the conductive layer 102 may be formed. Further, a tungsten film and a low-resistance region made of a low-resistance oxide semiconductor layer may be stacked.

Note that, as pretreatment, it is preferable that the substrate 100 formed through the steps up to and including the step of FIGS. 5A and 5B be preheated in a preheating chamber of a sputtering apparatus and impurities such as hydrogen, water, a hydroxyl group, or hydride attached to the substrate 100 be eliminated and removed so that hydrogen is contained in the oxide semiconductor layer 103D as little as possible. As an exhaustion unit provided in the preheating chamber, a cryopump is preferable. Note that this preheating treatment can be omitted.

Note that before the oxide semiconductor layer 103D is formed by a sputtering method, reverse sputtering in which plasma is generated by introduction of an argon gas is preferably performed so that dust or an oxide film which is attached to a surface of the conductive layer 102 is removed, in which case the resistance at an interface between the conductive layer 102 and the oxide semiconductor layer 103D can be reduced. The reverse sputtering refers to a method of modifying a surface of a substrate by applying a voltage to the substrate using an RF power source in an argon atmosphere to form plasma in a vicinity of the substrate. Note that instead of an argon atmosphere, a nitrogen atmosphere, a helium atmosphere, or the like may be used. Alternatively, an argon atmosphere to which oxygen, nitrous oxide, or the like is added may be used. Further, an argon atmosphere to which chlorine, carbon tetrafluoride, or the like is added may be used.

In this embodiment, the oxide semiconductor layer 103D is formed by a sputtering method using In—Ga—Zn-based oxide semiconductor target. Further, the oxide semiconductor layer 103D can be formed with a sputtering method in a rare gas (typically, argon) atmosphere, an oxygen atmosphere, or an atmosphere containing a rare gas (typically, argon) and oxygen. When a sputtering method is employed, a target containing $SiO_2$ at 2 wt % to 10 wt % may be used.

As a sputtering gas used for forming the oxide semiconductor layer 103D, a high-purity gas is preferably used in which impurities such as hydrogen, water, a hydroxyl group, or hydride are reduced to a concentration of a "ppm" level or a "ppb" level.

As the target for forming the oxide semiconductor film by a sputtering method, a metal oxide target containing zinc oxide as a main component can be used. As another example of a metal oxide target, an oxide semiconductor target containing In, Ga, and Zn (in a composition ratio, $In_2O_3:Ga_2O_3$: ZnO=1:1:1 in a molar ratio, In:Ga:Zn=1:1:0.5 in a molar ratio) can be used. In addition, as the oxide semiconductor target containing In, Ga, and Zn, a target having a composition ratio of In:Ga:Zn=1:1:1 in a molar ratio or In:Ga:Zn=1:1:2 in a molar ratio can be used. The filling rate of the oxide semiconductor target is greater than or equal to 90% and less than or equal to 100%, preferably, greater than or equal to 95% and less than or equal to 99.9%. An oxide semiconductor layer which is formed using the oxide semiconductor target with high filling rate is dense.

The oxide semiconductor layer 103D is formed over the conductive layer 102 in such a manner that a sputtering gas from which hydrogen, water, a hydroxyl group, hydride, or the like is removed is introduced into the treatment chamber and a metal oxide is used as a target while the substrate is kept in the treatment chamber in a reduced-pressure state and moisture remaining in the treatment chamber is removed. It is preferable to use an entrapment vacuum pump in order to remove hydrogen, water, a hydroxyl group, hydride, or the like remaining in the treatment chamber. For example, a cryopump, an ion pump, or a titanium sublimation pump is preferably used. The evacuation unit may be a turbo pump provided with a cold trap. For example, hydrogen, water, a hydroxy group, hydride, or the like (more preferably, including a compound containing a carbon atom) is exhausted from the treatment chamber with the use of a cryopump. Therefore, the concentration of impurities contained in the oxide semiconductor layer 103D formed in this chamber can be reduced. The oxide semiconductor layer 103D may be formed while the substrate is heated.

The oxide semiconductor layer 103D becomes the oxide semiconductor that is i-type (intrinsic) or substantially i-type and has a carrier density, which depends on donors such as hydrogen, of less than or equal to $1\times10^{13}/cm^3$, by heat treatment performed thereon after the oxide semiconductor layer 103D is formed.

Next, a resist mask is formed over the conductive layer 104D by a photolithography process and the conductive layer 104D to be the conductive layer 104 and the oxide semiconductor layer 103D to be the oxide semiconductor layer 103 are etched using the resist mask. When a photolithography step is employed, such etching enables their edges to be tapered by performing etching while removing the resist mask, thereby allowing an insulating layer 105 subsequently formed to have a higher step coverage.

Figure 7A:
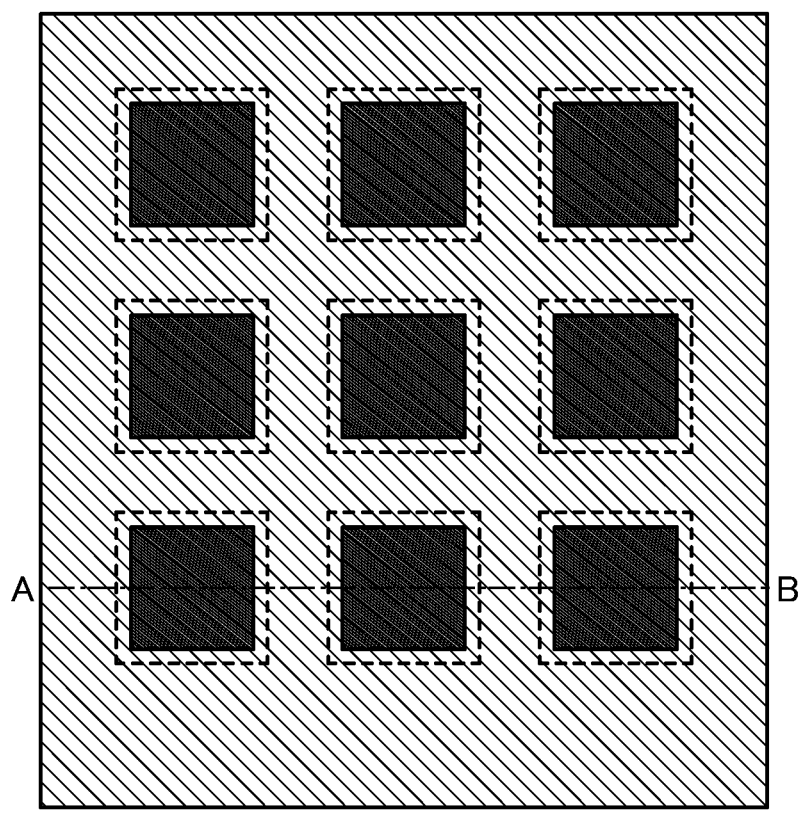
FIG. 7A and FIG. 7B are a top view and a cross-sectional view illustrating one embodiment of the present invention.
Figure 7B:
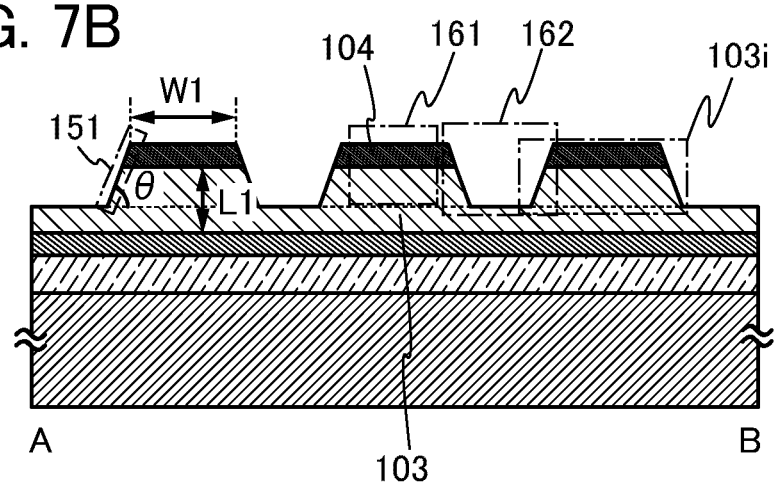

FIG. 7A is a top view in which the oxide semiconductor layer 103 and the conductive layer 104 over the oxide semiconductor layer 103 are formed. FIG. 7B is a cross-sectional view taken along dashed-dotted line A-B in the top view in FIG. 7A. As illustrated in FIG. 7B, the oxide semiconductor layer 103 and the conductive layer 104 are processed by etching, so that a projection 161 and a depression 162 are formed in the surface. Consequently, the island-shaped region 103i can be formed using the oxide semiconductor layer 103 and the conductive layer 104 over the oxide semiconductor layer 103.

The island-shaped region 103i has a cross section whose side surface has the tapered shape 151. A length W1 of the cross section of the conductive layer 104 which is an upper portion of the island-shaped region 103i illustrated in FIG. 7B is preferably greater than or equal to 1.5 µm and less than or equal to 2 µm. A thickness L1 of the projection 161 of the oxide semiconductor layer 103 is preferably greater than or equal to 3 µm and less than or equal to 4 µm. An angle θ made by a bottom surface of the island-shaped region 103i and a side surface of the tapered shape 151 is preferably greater than or equal to 60° and less than or equal to 70°.

In FIG. 7B, the shape of the cross section of the depression 162 which determines the shape of the island-shaped region 103i is a trapezoid whose upper base is longer than the lower base, but instead, another shape can be applied. For example, the shape of the cross section of the depression 162 may be a U-shape, a saw-toothed shape, or a rectangular shape. The shape of the cross section of the depression 162 may be the shape in consideration of the step coverage with an insulating layer formed later or the like.

Note that the etching of the oxide semiconductor layer 103D and the conductive layer 104D here may be performed using either dry etching or wet etching, or using both dry etching and wet etching. The etching conditions (such as an etchant, etching time, and temperature) are adjusted as appropriate in accordance with the material in order to form the oxide semiconductor layer 103 and the conductive layer 104 with desired shapes.

Figure 8A:
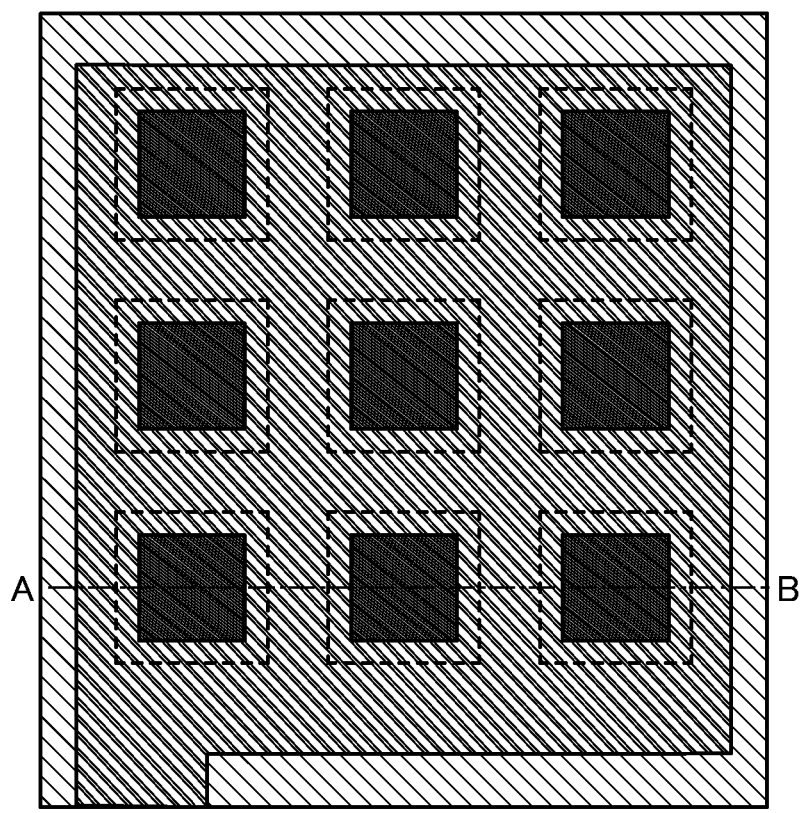
FIG. 8A and FIG. 8B are a top view and a cross-sectional view illustrating one embodiment of the present invention.
Figure 8B:
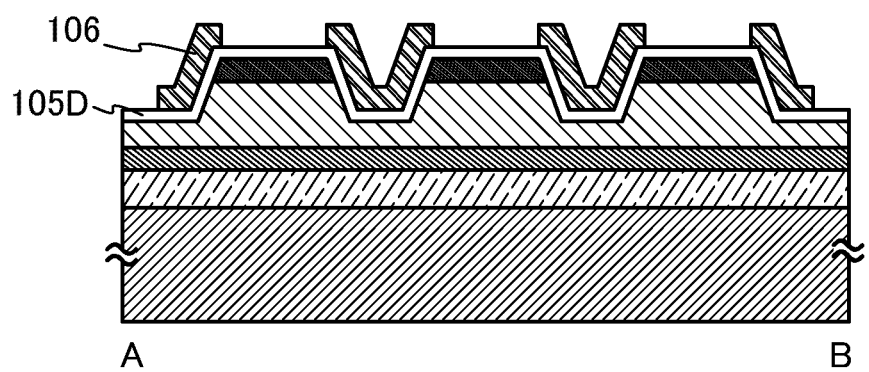

Next, an insulating layer 105D is formed over the oxide semiconductor layer 103 and the conductive layer 104. In addition, a conductive layer is formed over the insulating layer 105D, and a conductive layer 106 is formed by etching using a photolithography method. FIG. 8A is a top view in which the insulating layer 105D and the conductive layer 106 are formed. FIG. 8B is a cross-sectional view taken along dashed-dotted line A-B in the top view in FIG. 8A.

Note that the insulating layer 105D described in FIGS. 8A and 8B corresponds to the insulating layer 105 illustrated in FIG. 1B before the opening portion 152 is formed therein. That is, the insulating layer 105D becomes the insulating layer 105 in a later step. Therefore, in the drawings, the insulating layer 105D and the insulating layer 105 are described with different reference numerals.

The insulating layer 105D can be formed by a sputtering method which is a physical vapor deposition (PVD) method, a vacuum deposition method, or a chemical vapor deposition (CVD) method. The transistor 110 in FIG. 1B is a vertical transistor, and thus has an oxide semiconductor layer serving as a channel formation region which is longer in the thickness vertical direction. For this reason, the insulating layer 105D formed by a CVD method has a higher coverage than that formed by a PVD method such as a sputtering method.

Here, a silicon oxide film ($SiO_x$($x>0$)) to be the insulating layer 105D is formed by a plasma CVD method, which is a kind of a CVD method. The insulating layer 105D is either a single layer or a stacked layer, i.e., a silicon nitride film ($SiN_y$ ($y>0$)) may be formed over the above-stated silicon oxide film ($SiO_x$ ($x>0$)) by a plasma CVD method.

It is preferable that the insulating layer 105D contain little impurities such as hydrogen and water. As an example, impurities such as hydrogen and water can be reduced by, in the formation of the silicon oxide film by a plasma CVD method, removing impurities such as hydrogen and water which remain in the reaction chamber of the plasma CVD apparatus or which are adsorbed to the inner wall of the reaction chamber, and forming the layer while heating the inner wall of the reaction chamber.

In the case where the insulating layer 105D is formed by a sputtering method, a silicon target or a quartz target is used as a target and oxygen or a mixed gas of oxygen and argon is used as a sputtering gas.

The conductive layer 106 is formed using a metal element selected from aluminum, chromium, copper, tantalum, titanium, molybdenum, tungsten, and yttrium; an alloy containing any of these metal elements as a component; an alloy containing any of these metal elements in combination; or the like by a sputtering method. In addition, the conductive layer 106 can have a single-layer structure or a stacked structure having two or more layers.

Note that the conductive layer 106 is formed by forming a resist mask, performing etching, and removing the resist mask. The surface of the formed conductive layer 106 is preferably planarized by a planarization step such as CMP (chemical mechanical polish).

Figure 9A:
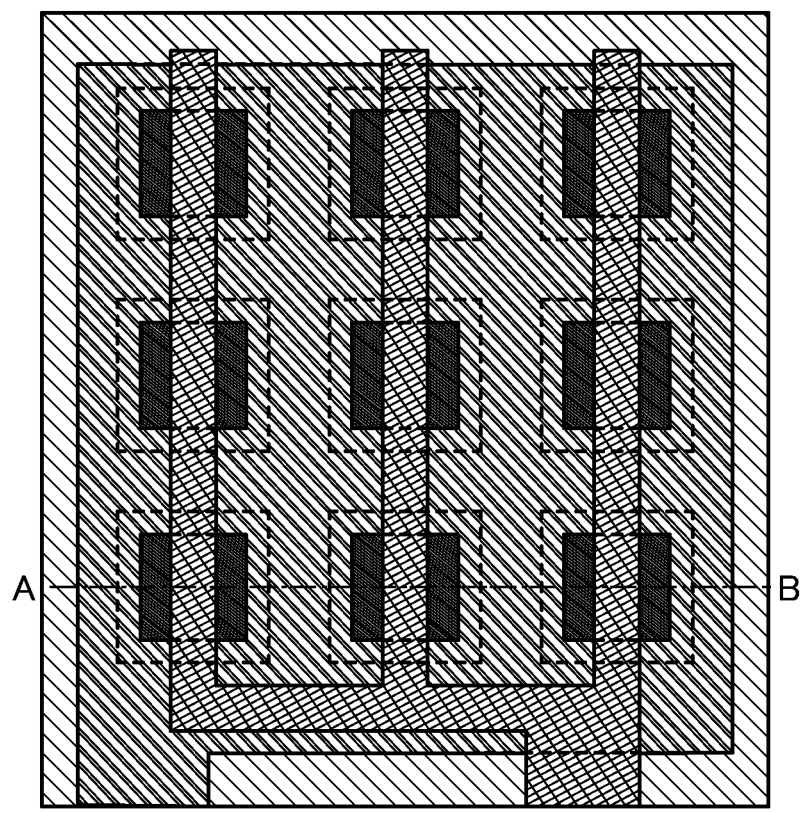
FIG. 9A and FIG. 9B are a top view and a cross-sectional view illustrating one embodiment of the present invention.
Figure 9B:
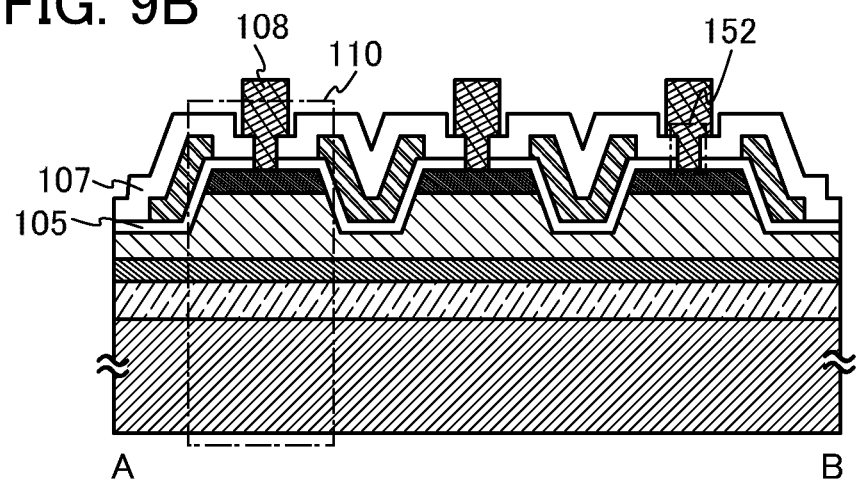

Next, an insulating layer is formed over the insulating layer 105D and the conductive layer 106, the opening portion 152 is formed in the insulating layer and the insulating layer 105D, so that the insulating layer 107 is formed. Then, a conductive layer is formed to fill the opening portion 152 and etched by a photolithography method, so that a conductive layer 108 is formed. FIG. 9A is a top view in which the conductive layer 108 is formed. FIG. 9B is a cross-sectional view taken along dashed-dotted line A-B in the top view in FIG. 9A.

In FIG. 1B, a structure in which the oxide semiconductor layer 103 remains in a horizontal direction of the cross-sectional view over the conductive layer 102; however, another structure can also be used.

Figure 10:
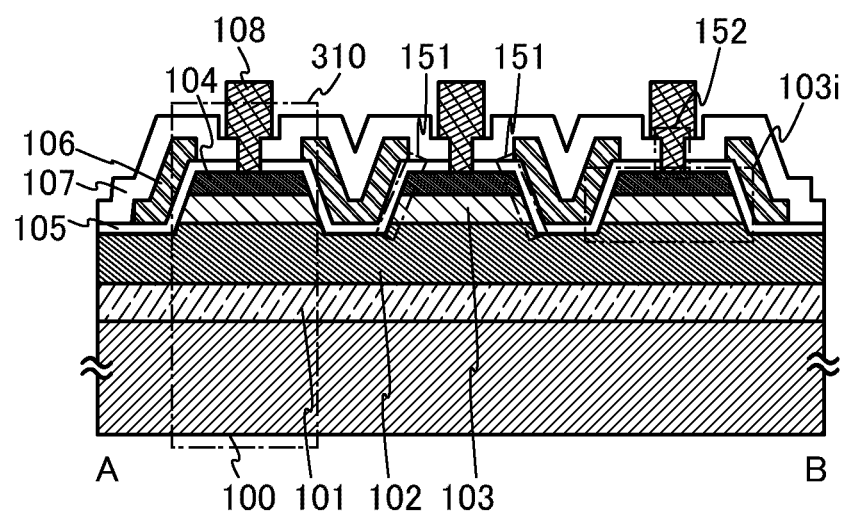
FIG. 10 is a cross-sectional view illustrating one embodiment of the present invention.

For example, as the cross-sectional view illustrated in FIG. 10, a structure in which the oxide semiconductor layer 103 is divided in a horizontal direction of the cross-sectional view over the conductive layer 102 can be used.

With the structure of a transistor 310 as the cross-sectional view illustrated in FIG. 10, by control of an electric field by the conductive layer 106 to the oxide semiconductor layer in the island-shaped region 103i, the amount of the current through the transistor 310 can be controlled. In the structure illustrated in FIG. 10, by the conductive layer 102 provided in a horizontal direction of the substrate 100, the transistors 310 are connected to each other, and thus the amount of current flowing through the semiconductor device is estimated by the sum of the amount of current flowing through each of the transistors 310. Therefore, among the plurality of transistors 310 by reducing variation of the shape of the oxide semiconductor layer in the island-shaped region 103i, the sum of the amount of current flowing through the semiconductor device can be estimated easily.

Alternatively, another structure in which the conductive layer 102 between the conductive layer 101 and the oxide semiconductor layer 103 is not provided can be used. For example, as the cross-sectional view illustrated in FIG. 11, a structure in which the oxide semiconductor layer 103 is formed directly over the conductive layer 101 may be used.

Figure 11:
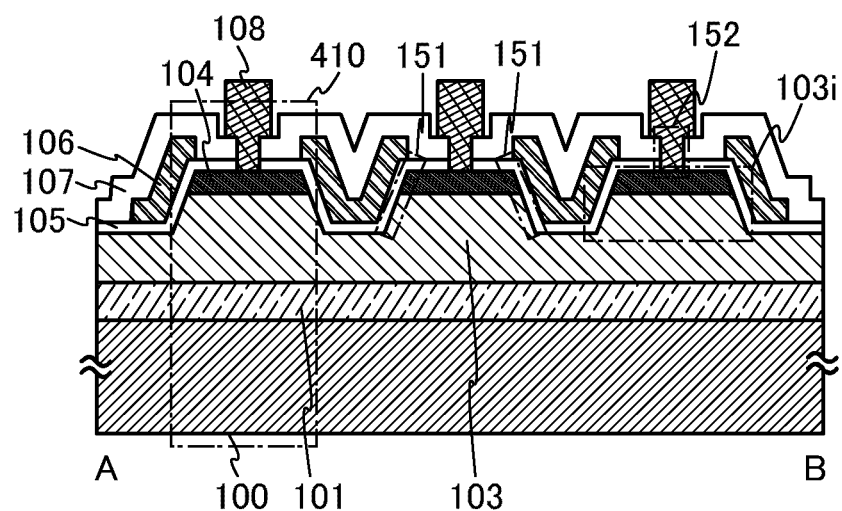
FIG. 11 is a cross-sectional view illustrating one embodiment of the present invention.

With the structure of a transistor 410 as shown in the cross-sectional view illustrated in FIG. 11, a step of forming the conductive layer 102 can be omitted, leading to reduction in manufacturing time and manufacturing cost.

The semiconductor device which is one embodiment of the present invention as described above can exhibit favorable transistor characteristics and secure higher drain current. Moreover, in a semiconductor device which is one embodiment of the present invention, output current per unit area can be increased by connecting a plurality of devices in parallel to each other. Further, in one embodiment of the present invention, a semiconductor device having a high heat radiation function can be obtained by using a metal substrate having high thermal conductivity as a substrate on which a transistor is formed.

Note that in this embodiment, what is illustrated in the drawing can be freely combined with or replaced with what is described in another embodiment as appropriate.

(Embodiment 2)

In this embodiment, a semiconductor device having a structure which is different from that of the semiconductor device in Embodiment 1 is described. A transistor having a configuration different from that of the transistor described in Embodiment 1 is described.

Figure 12A:
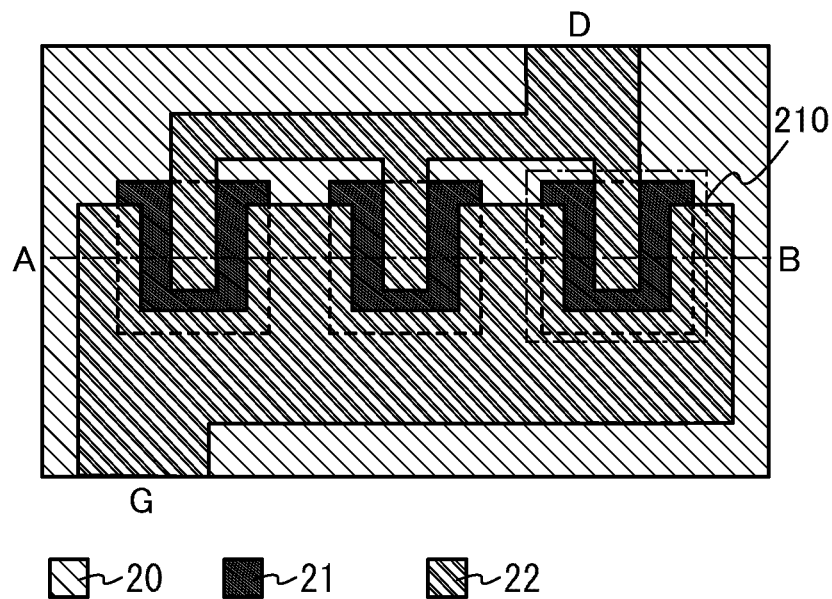
FIG. 12A and FIG. 12B are a top view and a cross-sectional view illustrating one embodiment of the present invention.
Figure 12B:
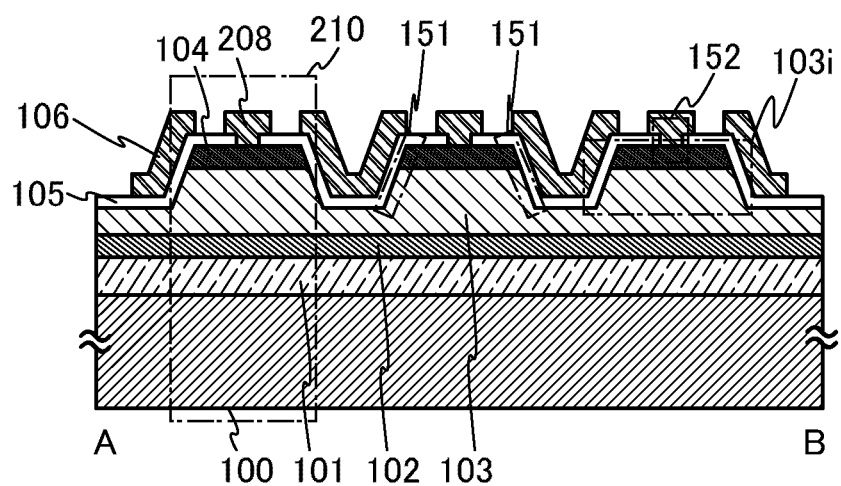

FIG. 12A is a top view of a transistor 210 included in a semiconductor device. FIG. 12B is a cross-sectional view along line A-B of FIG. 12A.

The top view illustrated in FIG. 12A is a layout view of an oxide semiconductor layer 20, a conductive layer 21, and a conductive layer 22.

The oxide semiconductor layer 20 in FIG. 12A corresponds to the oxide semiconductor layer 10 in FIG. 1A. The conductive layer 21 in FIG. 12A corresponds to the conductive layer 11 in FIG. 1A. The conductive layer 22 in FIG. 12A corresponds to the conductive layer 12 in FIG. 1A.

The layout in the top view in FIG. 12A is different from the layout in the top view in FIG. 1A in that a conductive layer which is connected to a conductive layer 104 and a conductive layer 106 which functions as a gate electrode are formed using the same conductive layer 22 as illustrated in FIG. 12B. In other words, in FIG. 12A, the conductive layer 22 has a function of the conductive layer 13 in FIG. 1A.

Note that in FIG. 12A, in order to be connected to different external elements, the conductive layers 22 extending from the transistor 210 are provided in a comb shape so as not to intersect with each other over the transistor 210. Specifically, as illustrated in FIG. 12A, the terminal G and the terminal D are provided so as not to intersect with each other.

Next, a cross-sectional view of the transistor 210 is described with reference to FIG. 12B.

In the cross-sectional view in FIG. 12B, the transistor 210 includes a substrate 100, a conductive layer 101, a conductive layer 102, an oxide semiconductor layer 103, a conductive layer 104, an insulating layer 105, a conductive layer 106, and a conductive layer 208. In FIG. 12B, in the oxide semiconductor layer 103, an island-shaped region 103i is represented.

In FIG. 12B, the island-shaped regions 103i in the cross section have tapered shapes 151 on the side surface. In FIG. 12B, an opening portion (a contact hole) 152 is provided in the insulating layer 105.

As described-above, the cross section of the transistor 210 in FIG. 12B is different from that of the transistor 110 in FIG. 1B in that the insulating layer 107 and the conductive layer 108 in FIG. 1B are omitted, and that the conductive layer 208 which is connected to the conductive layer 104 is formed in the same layer as the conductive layer 106. Therefore, manufacturing steps of forming the insulating layer 107 and the conductive layer 108 can be omitted, and the manufacturing time and manufacturing cost can be reduced.

The above-described semiconductor device which is one embodiment of the present invention can have favorable transistor characteristics and secure higher drain current. Moreover, in a semiconductor device which is one embodiment of the present invention, output current per unit area can be increased by connecting a plurality of devices in parallel to each other. Further, in one embodiment of the present invention, a semiconductor device having a high heat radiation function can be obtained by using a metal substrate having high thermal conductivity as a substrate on which a transistor is formed.

As compared to the above effect, in the semiconductor device in one embodiment of the present invention, the formation of a conductive layer and an insulating layer can be omitted. Therefore, manufacturing cost can be reduced.

Note that in this embodiment, what is illustrated in the drawing can be freely combined with or replaced with what is described in another embodiment as appropriate.

(Embodiment 3)

In this embodiment, one embodiment of the configuration of a power converter circuit such as an inverter, and a converter including the insulated-gate field-effect transistor described in Embodiment 1 and Embodiment 2 is described. In this embodiment, FIGS. 13A and 13B each show an example of the configuration of a DC-DC converter, and FIG. 14 shows an example of the configuration of an inverter.

Figure 13A:
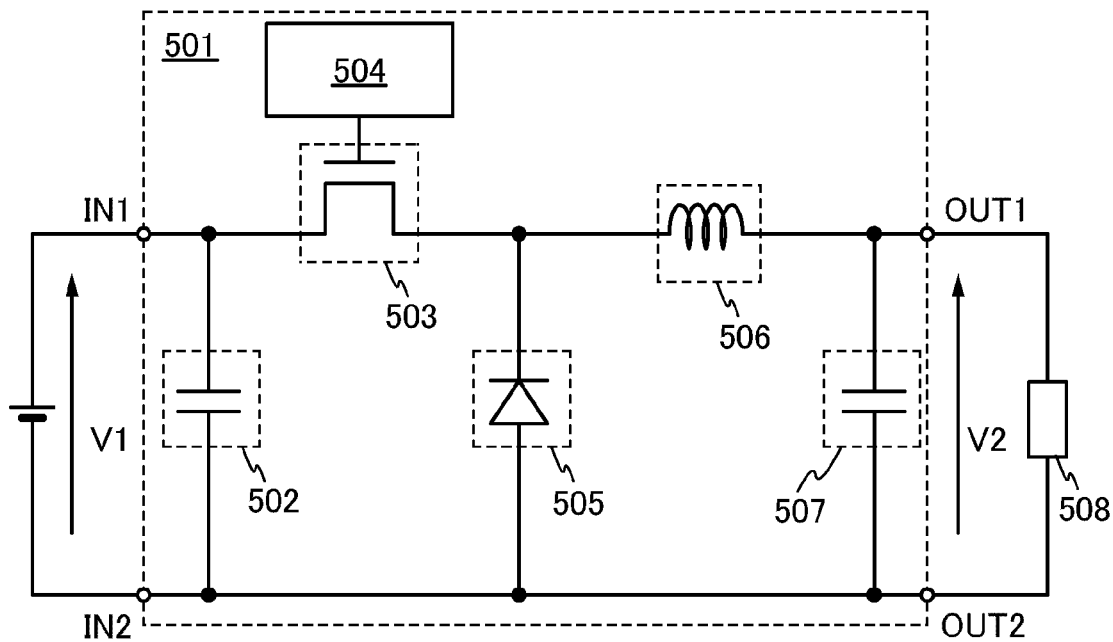
FIGS. 13A and 13B are block diagrams each illustrating one embodiment of the present invention.
Figure 14:
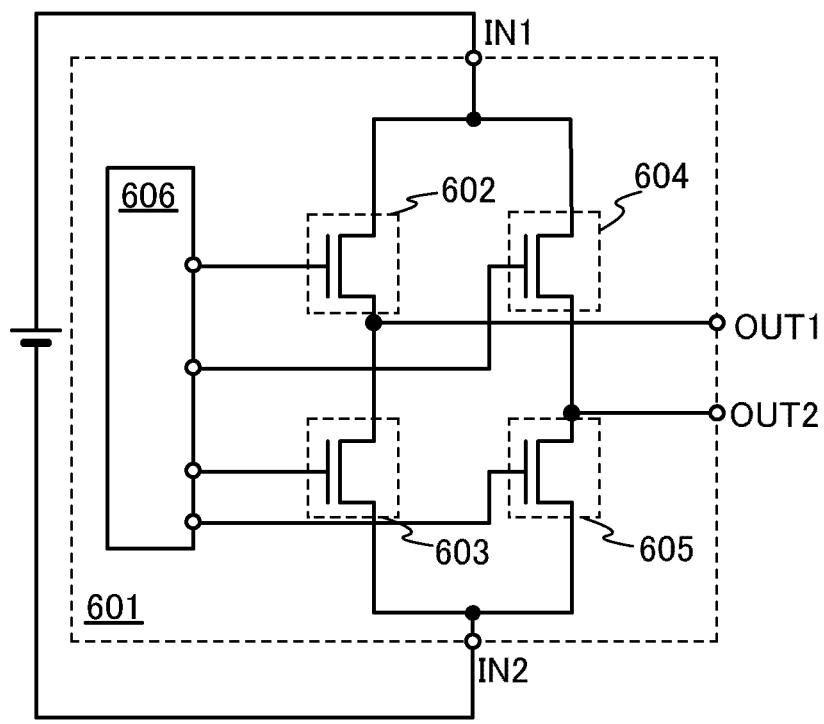
FIG. 14 is a block diagram illustrating one embodiment of the present invention.

A DC-DC converter 501 in FIG. 13A is an example of a step-down DC-DC converter using a chopper circuit. The DC-DC converter 501 includes a capacitor 502, an IGFET 503, a control circuit 504, a diode 505, a coil 506, and a capacitor 507.

The DC-DC converter 501 in FIG. 13A is operated by a switching operation of the IGFET 503 with the control circuit 504. By the DC-DC converter 501, an input voltage V1 applied to input terminals IN1 and IN2 can be output from output terminals OUT1 and OUT2 to a load 508 as a stepped-down voltage V2 which is stepped down. The semiconductor device described in the above embodiment can be applied to the IGFET 503 included in the DC-DC converter 501. Therefore, high output current can flow through the DC-DC converter 501 by the switching operation, and off-state current can be reduced. Therefore, the DC-DC converter consumes less power and can operate at high speed.

Although a step-down DC-DC converter using a chopper circuit is shown in FIG. 13A as an example of the non-isolated power converter circuit, the semiconductor device described in the above embodiment can also be applied to an IGFET included in a step-up DC-DC converter using a chopper circuit or a step-up/step-down DC-DC converter using a chopper circuit. Therefore, high output current can flow through the DC-DC converter 501 by the switching operation, and off-state current can be reduced. Therefore, a DC-DC converter in which power consumption is reduced and high speed operation can be performed can be achieved.

Figure 13B:
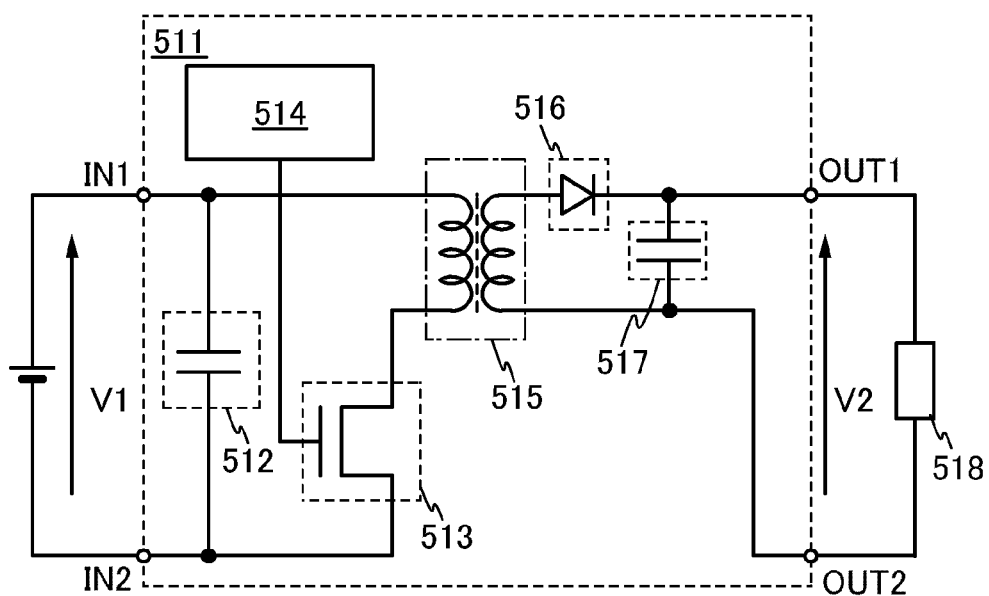

Next, a DC-DC converter 511 illustrated in FIG. 13B is an example of a fly-back converter which is an isolated power converter circuit. The DC-DC converter 511 includes a capacitor 512, an IGFET 513, a control circuit 514, a transformer 515 including a primary coil and a secondary coil, a diode 516, and a capacitor 517.

The DC-DC converter 511 in FIG. 13B is operated by a switching operation of the IGFET 513 with the control circuit 514. By the DC-DC converter 511, an input voltage V1 applied to input terminals IN1 and IN2 can be output from output terminals OUT1 and OUT2 to a load 518 as a voltage V2 which is stepped up or stepped down. The semiconductor device described in the above embodiment can be applied to the IGFET 513 included in the DC-DC converter 511. Therefore, high output current can flow by the switching operation, and off-state current can be reduced. Therefore, a DC-DC converter in which power consumption is reduced and high speed operation can be performed can be achieved.

Note that the semiconductor device described in the above embodiment can also be applied to an IGFET included in a forward DC-DC converter.

An inverter 601 in FIG. 14 is an example of a full-bridge inverter. The inverter 601 includes an IGFET 602, an IGFET 603, an IGFET 604, an IGFET 605, and a control circuit 606.

The inverter 601 in FIG. 14 is operated by a switching operation of the IGFETs 602 to 605 with the control circuit 606. A direct-current voltage V1 applied to input terminals IN1 and IN2 can be output from output terminals OUT1 and OUT2 as an alternating-current voltage V2. The semiconductor device described in the above embodiment can be applied to the IGFETs 602 to 605 included in the inverter 601. Therefore, high output current can flow by the switching operation, and off-state current can be reduced. Therefore, a DC-DC converter in which power consumption is reduced and high speed operation can be performed can be achieved.

Note that in this embodiment, what is illustrated in the drawing can be freely combined with or replaced with what is described in another embodiment as appropriate.

(Embodiment 4)

In this embodiment, applications of the power converter circuit of Embodiment 3 are described. The power converter circuit such as a converter or an inverter of Embodiment 2 can be used, for example, in an electric vehicle working with electric power such as battery power.

Application examples for electric vehicles are described with reference to FIGS. 15A and 15B.

Figure 15A:
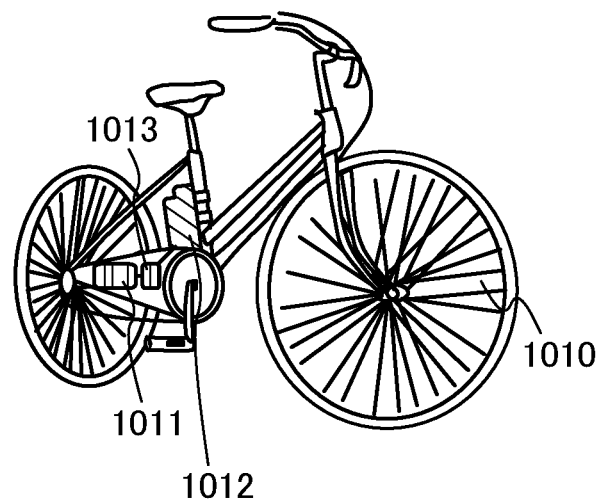
FIGS. 15A and 15B each illustrate an application product of one embodiment of the present invention.

FIG. 15A illustrates an electric bicycle 1010 as an example application for an electric vehicle including a power converter circuit. The electric bicycle 1010 obtains power when current flows through a motor unit 1011. The electric bicycle 1010 includes a battery 1012 and a power converter circuit 1013 which are used to feed current through the motor 1011. Although not illustrated, an additional electric generator or the like may be provided in the electric bicycle 1010 in FIG. 15A for the purpose of charging the battery 1012. The power converter circuit of Embodiment 2 can be used as the power converter circuit 1013. Therefore, by the IGFET included in the power converter circuit 1013, power consumption is reduced and high-speed operation can be achieved, so that the electric bicycle 1010 can be driven with fewer defects. Note that although a pedal is illustrated in FIG. 15A, the pedal is not necessarily provided.

Figure 15B:
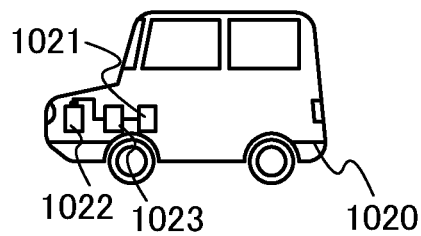

FIG. 15B illustrates an electric car 1020 as an example application for an electric vehicle including a power converter circuit. The electric car 1020 obtains power when current flows through a motor unit 1021. The electric car 1020 includes a battery 1022 and a power converter circuit 1023 which are used to feed current to the motor 1021. Although not illustrated, an additional electric generator or the like may be provided in the electric car 1020 in FIG. 15B for the purpose of charging the battery 1022. The power converter circuit of Embodiment 2 can be used as the power converter circuit 1023. Therefore, by the IGFET included in the power converter circuit 1023, power consumption is reduced and high-speed operation can be achieved, so that the electric bicycle 1020 can be driven with fewer defects.

Note that in this embodiment, what is illustrated in the drawing can be freely combined with or replaced with what is described in another embodiment as appropriate.

This application is based on Japanese Patent Application serial no. 2011-156225 filed with Japan Patent Office on Jul. 15, 2011, the entire contents of which are hereby incorporated by reference.

What is claimed is:

1. A semiconductor device comprising:
   a metal substrate;
   a first electrode over the metal substrate;
   an oxide semiconductor layer over the first electrode, the oxide semiconductor layer comprising a first island-shaped region and a second island-shaped region adjacent to the first island-shaped region;
   a second electrode over a top surface of the first island-shaped region;
   a third electrode over a top surface of the second island-shaped region;
   a first insulating layer over the oxide semiconductor layer, the second electrode and the third electrode;
   a gate electrode over a side surface of the first island-shaped region and a side surface of the second island-shaped region, wherein the first insulating layer is located between the gate electrode and the first island-shaped region and between the gate electrode and the second island-shaped region;
   a second insulating layer over the first insulating layer and the gate electrode; and
   a conductive layer over the first insulating layer and the second insulating layer, the conductive layer electrically connected to the second electrode and the third electrode.

2. The semiconductor device according to claim 1, wherein the gate electrode is located between the first island-shaped region and the second island-shaped region.

3. The semiconductor device according to claim 1, wherein the second electrode includes an oxide semiconductor layer including phosphorus or boron.

4. The semiconductor device according to claim 1, wherein the first electrode includes tungsten.

5. The semiconductor device according to claim 1, wherein each of the first island-shaped region and the second island-shaped region has a tapered shape.

6. The semiconductor device according to claim 1, further comprising a second conductive layer between the first electrode and the oxide semiconductor layer.

7. The semiconductor device according to claim 1, wherein the second electrode is overlapped with the second insulating layer with the first insulating layer located therebetween.

8. The semiconductor device according to claim 1,
   wherein the oxide semiconductor layer has depression between the first island-shaped region and the second island-shaped region, and
   wherein the first insulating layer is in contact with a surface of the depression.

9. The semiconductor device according to claim 1,
wherein the conductive layer passes through a first opening in the gate electrode so as to be electrically connected to the second electrode, and
wherein the conductive layer passes through a second opening in the gate electrode so as to be electrically connected to the third electrode.

10. The semiconductor device according to claim 1, wherein the oxide semiconductor layer comprises a crystal part, a direction of c-axis of the crystal part is substantially parallel to a normal vector of a surface of the oxide semiconductor layer.

11. A semiconductor device comprising:
a first electrode;
an oxide semiconductor layer over the first electrode, the oxide semiconductor layer comprises a first island-shaped region and a second island-shaped region adjacent to the first island-shaped region;
a second electrode over a top surface of the first island-shaped region;
a third electrode over a top surface of the second island-shaped region;
an insulating layer over the oxide semiconductor layer, the second electrode and the third electrode; and
a gate electrode over a side surface of the first island-shaped region and a side surface of the second island-shaped region, wherein the insulating layer is located between the gate electrode and the first island-shaped region and between the gate electrode and the second island-shaped region; and
a conductive layer over the insulating layer, the conductive layer electrically connected to the second electrode and the third electrode.

12. The semiconductor device according to claim 11, wherein the gate electrode is located between the first island-shaped region and the second island-shaped region.

13. The semiconductor device according to claim 11, wherein the second electrode includes an oxide semiconductor layer including phosphorus or boron.

14. The semiconductor device according to claim 11, wherein the first electrode includes tungsten.

15. The semiconductor device according to claim 11, wherein each of the first island-shaped region and the second island-shaped region has a tapered shape.

16. The semiconductor device according to claim 11, further comprising a second conductive layer between the first electrode and the oxide semiconductor layer.

17. The semiconductor device according to claim 11, wherein the gate electrode and the conductive layer are over and in contact with a top surface of a same layer.

18. The semiconductor device according to claim 11,
wherein the oxide semiconductor layer has depression between the first island-shaped region and the second island-shaped region, and
wherein the insulating layer is in contact with a surface of the depression.

19. The semiconductor device according to claim 11,
wherein the conductive layer passes through a first opening in the gate electrode so as to be electrically connected to the second electrode, and
wherein the conductive layer passes through a second opening in the gate electrode so as to be electrically connected to the third electrode.

20. The semiconductor device according to claim 11, wherein the oxide semiconductor layer comprises a crystal part, a direction of c-axis of the crystal part is substantially parallel to a normal vector of a surface of the oxide semiconductor layer.

* * * * *